(12) United States Patent
Owen et al.

(10) Patent No.: US 7,889,048 B2
(45) Date of Patent: Feb. 15, 2011

(54) RESISTOR NETWORK AND VARIABLE RESISTOR SIMULATOR

(75) Inventors: David Paul Owen, Dunstable (GB); Keith Thomas Moore, Bradfield (GB)

(73) Assignee: Pickering Interfaces Limited, Essex (GB)

( * ) Notice: Subject to any disclaimer, the term of this patent is extended or adjusted under 35 U.S.C. 154(b) by 502 days.

(21) Appl. No.: 12/052,926

(22) Filed: Mar. 21, 2008

(65) Prior Publication Data
US 2008/0231412 A1   Sep. 25, 2008

(30) Foreign Application Priority Data
Mar. 23, 2007   (GB) .................................. 0705579.1

(51) Int. Cl.
*H01C 10/30*   (2006.01)
(52) U.S. Cl. .................... 338/118; 338/200; 323/354
(58) Field of Classification Search ................. 338/118, 338/120, 68, 200–202, 295; 323/396, 291, 323/354
See application file for complete search history.

(56) References Cited

U.S. PATENT DOCUMENTS

| | | | | |
|---|---|---|---|---|
| 3,679,967 A | * | 7/1972 | Staker | 323/233 |
| 4,626,804 A | * | 12/1986 | Risher et al. | 333/22 R |
| 5,293,148 A | * | 3/1994 | Hancock | 338/295 |
| 7,619,502 B2 | * | 11/2009 | Prabhakaran et al. | 338/302 |
| 2002/0167749 A1 | * | 11/2002 | Kulakowski et al. | 360/69 |

* cited by examiner

*Primary Examiner*—Kyung Lee
(74) *Attorney, Agent, or Firm*—Andrus, Sceales, Starke & Sawall, LLP (57) ABSTRACT

A variable resistor network has a coarse resistance network and a fine resistance network connected in series with the coarse network. The coarse resistance network comprises a chain of series-connected resistors any one or more of which may be switched out of the series by individual parallel-connected relays. The fine network comprises a shunt resistor together with a fixed resistor and a series-connected adjustable resistor together connected in parallel with the shunt resistor. A control circuit is arranged to control the relays for the switching of the resistors of the coarse network and also to control adjustment of the adjustable resistor. A chosen resistance value can be set by appropriate switching of the coarse network and adjustment of the adjustable resistor.

19 Claims, 5 Drawing Sheets

Precision Resistor using binary chain, digital potentiometer and a calibration port R1 = 1 ohm          R2 = 2 ohm          R3 = 4 ohm          R4 = 8 ohm          R5 = 16 ohm         R6 = 32 ohm         R7 = 64 ohm
R8 = 128 ohm        R9 = 256 ohm        R10 = 512 ohm       R11 = 1024 ohm      R12 = 2048 ohm      R13 = 4096 ohm      R14 = 8192 ohm Programmable resistor using simple binary chain

Precision Resistor using binary chain, digital potentiometer and a calibration port

Figure 3

Plots showing the available when using Rseries = and Rshunt = with 4 AD5290 in parallel fine resistance control using the same code to each device

Figure 4

An alternative network topology to binary chains that reduces the number of relays in series at the expense of increased relay count and space.

Figure 5

Implementation with an input binary network, a multiplexer (MUX) network and fine control.

RESISTOR NETWORK AND VARIABLE RESISTOR SIMULATOR

CROSS-REFERENCE TO RELATED APPLICATION

This application is related to and claims priority from UK Patent Application No. 0705579.1 filed Mar. 23, 2007.

BACKGROUND OF THE INVENTION

1. Field of the Invention

This invention relates to a resistor network the resistance of which can be adjusted to suit a particular requirement. In its preferred aspects, this invention relates to a variable resistor network that can be programmed to provide an accurate simulation of a resistive sensor or another variable resistor, preferably adjustable over a large resistance range but with a fine control of total resistance.

2. Description of the Related Art

Many control systems use variable resistance devices as sensors to indicate the value of a parameter that is important to the operation of the system. Examples vary from simple fuel gauges that indicate the remaining amount of fuel in a tank to sensors that measure the temperature of air at an intake or an exhaust, water temperature or mechanical stress. In test applications it is important to be able accurately to simulate these variable resistance devices to check that the control system responds correctly by adjusting the operation of the system or by providing appropriate warning indicators. The behaviour has to be tested under both normal conditions and under fault conditions; for example, when a sensor fails or should the interconnection system fail, the readings from the sensor will be distorted.

Modern systems that control, for example, the operation of an engine can have many sensors present and the testing can be complex as engineers try to explore both the fault tolerance of the system and its behaviour as the sensors indicate changing conditions. It is not practical routinely to test the control system using a real engine, even when conducting type approval testing rather than a manufacturing test. As a result the sensors are often simulated by programmable resistors. Many of the currently available programmable resistors have significant short comings that make them less than ideal for this purpose.

Figure 1:
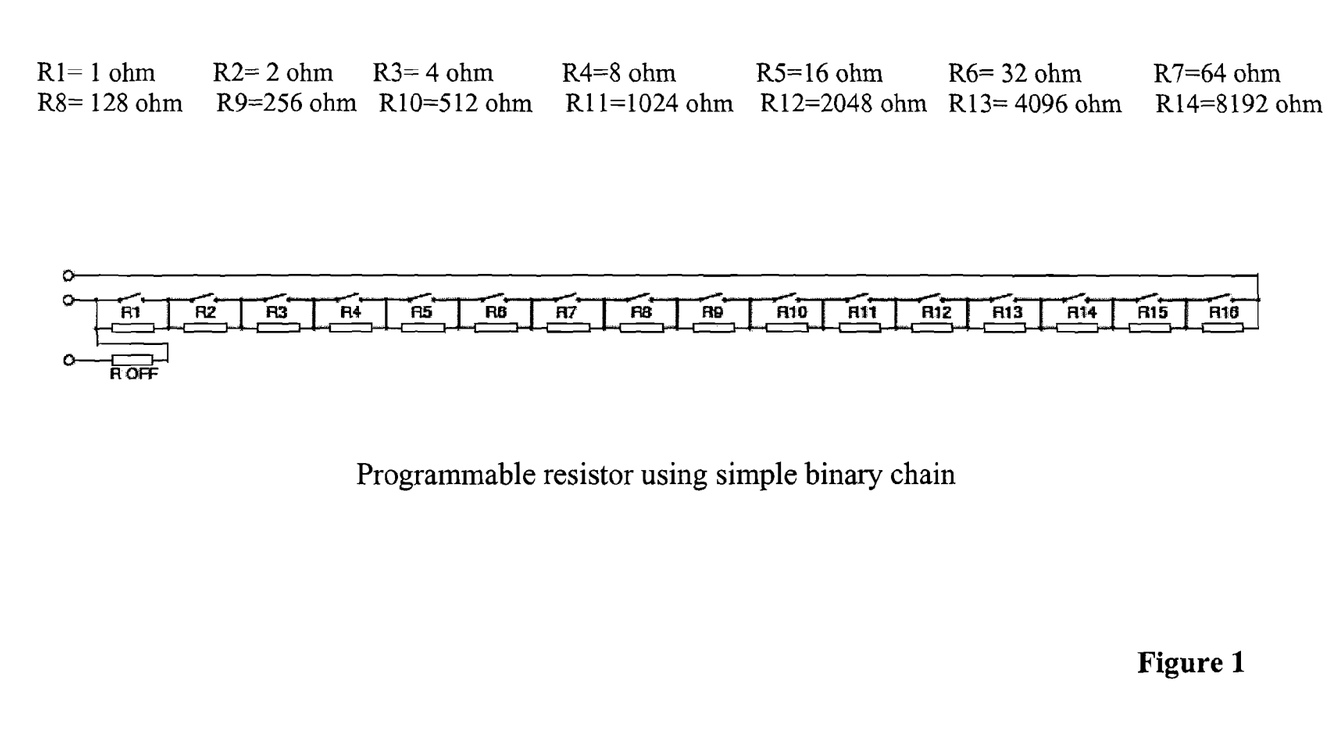
FIG. 1 is a diagram of a known form of variable resistor, using a simple binary chain.

There are many other applications for programmable resistors in electronic systems where there are similar requirements for a simple device that can simulate a resistor to a good precision, in a compact form factor. The most common method for implementing a variable resistor to simulate a sensor for use in an application as has been described above is to use a binary chain of resistors each of which can be shorted by a relay the contacts of which can be opened or closed under program control. An example of such a resistor is shown in FIG. 1 where each of the resistors R1, R2 . . . R16 has a reed relay arranged across its terminals and so can be taken out of circuit or included in the circuit between the resistor terminals T1 and T2.

An offset resistor (R OFF) is used to define the minimum value to which the variable resistor can be set. A binary weighted chain of resistors then provides the incremental values of resistance. The smallest resistor defines the smallest step size that can be set and the other resistors are binary weighted (1, 2, 4, 8 etc). In the example shown R1 has the smallest value of 1 ohm so the set resistance value can be nominally changed in 1 ohm steps by closing or opening the relay contacts associated with R1. For example, zero additional ohm to R OFF is obtained with all relays closed and 1 ohm by opening just the first relay. 2 ohm is obtained by opening just the second relay and 3 ohm by opening both the first and second relays.

The method is simple and efficient to implement but has some significant shortcomings:

- The relays do not provide perfect shorts so the change in value is not precisely as expected. If the relay contact resistance is 0.1 ohm (which is typical for a reed relay), then the 1 ohm increments are not precisely 1 ohm. As more relays are switched in and out, the errors accumulate and a fine adjustment of 1 ohm becomes less predictable.
- Resistor tolerance is a problem. When many resistors are switched out and substituted by a single resistor, the resistor tolerances can cause the total resistance of the chain to change by an amount significantly different from the 1 ohm, expected in this example.
- Resistors having special values and high tolerance are hard to purchase. They are not components that are commonly available from suppliers because they are not preferred values (usually referred to as E series values), so they have to be purchased from specialist suppliers at a high cost with long lead times and large minimum order quantities.
- If the application requires fine control of the resistance value, the sources of error tend to accumulate and be less predictable as the number of relays in the system increases.
- Interconnection resistances of PCB tracks between the relays can produce significant errors that vary unpredictably when the required resistance value is changed.

SUMMARY OF THE INVENTION

This invention aims at overcoming the limitations and disadvantages of current products, as discussed above. In its preferred forms, the invention aims at providing a resistance network which allows the generation of a selected resistance value within a large resistance range, conveniently in a compact form factor and with the ability to make relatively small adjustments to the resistance value.

According to one aspect of this invention, there is provided a variable resistor network comprising a coarse network having a chain of series-connected switchable resistors, a fine network connected in series with the coarse network and comprising a shunt resistor together with a series-connected fixed resistor and adjustable resistor connected in parallel with the shunt resistor, and a control circuit arranged to control the switching of the resistors of the coarse network and adjustment of the adjustable resistor whereby a chosen resistance value can be set by appropriate switching of the coarse network and adjustment of the adjustable resistor.

According to a second but closely related aspect of this invention, there is provided a method of operating a resistor network of this invention, which method comprises the steps of providing a resistor network as described, determining the terminal resistance for the network for a wide range of switch configuration and adjustment settings; storing the determined terminal resistance values against the switch configurations and adjustment settings; comparing a required resistance value with the stored values; and then adjusting the switch configuration and the adjustable resistor setting in order to provide a terminal resistance closely corresponding to the required value.

It will be appreciated that the resistance network of this invention need not require the use of specialist resistors and yet can produce fine control of the total resistance value. Further, the network allows setting to a precise resistance value as demanded, so essentially eliminating the effects of contact resistance variations, tolerance variations and so on. This is achieved by having a coarse resistance network and a fine resistance network. The coarse network is used to set a chosen resistance over a relatively large range and the fine network to adjust the resistance over a narrow range but with relatively high resolution. In its preferred aspects, a calibration system is provided to characterise the coarse and fine networks and then software may be used to combine these two networks to produce a net resistance the value of which is accurately known.

DESCRIPTION OF THE PREFERRED EMBODIMENTS

In implementing this invention, it is preferred for each resistor of the series-connected coarse network chain of resistance to have a relay, such as a reed relay or other electromechanical switch, connected thereacross, the control circuit being arranged to control independent operation of each relay. In this way, the resistor associated with each relay may be switched into the chain simply by opening the relay, and switched out of the chain by closing the relay. In a similar way, the adjustable resistor of the fine network could also comprise a chain of series-connected switchable resistors, with the control circuit being arranged to control the switching thereof, preferably by controlling relays as with the coarse network.

In a preferred embodiment, the adjustable resistor of the fine network comprises at least one software-controlled digital potentiometer, the control circuit being arranged to provide a drive signal for the or each digital potentiometer thereby to select a chosen resistance value. If more than one digital potentiometer is employed, the potentiometers may be connected in parallel and may be supplied with the same control signals, or for a finer degree of control (resolution) with different control signals. Such digital potentiometers are well known in the art and can be obtained from several different manufacturers. By way of example, mention may here be made of Analog Devices Component No. AD5290 that can be set to a value between zero ohm and 10 kohm using an 8-bit word to select the chosen value.

Preferably, the coarse network comprises a series-connected chain of binary resistors, though each resistor of the coarse network could have a value of less than twice the value of the preceding resistor in the chain, to ensure a required resistance can be selected, notwithstanding the errors in the system. For example, the binary chain may use powers of slightly less than 2.

An embodiment of resistor network of this invention uses a plurality of chains (and typically three chains) of series-connected switchable resistors any one or more of which chains may be switched into or out of the coarse resistance network or into or out of the fine resistance network. The chains may thus be multiplexed as required allowing selection of an appropriate resistance for the coarse network or the fine network, while using a minimum of resistors and so also minimising the number of relay contacts in series.

Most preferably, a digital resistance sensor (typically in the form of a DMM) is provided to detect the terminal resistance of the resistor network. The resistance sensor may separately sense the resistance of the coarse network and of the fine network and advantageously uses a 4-wire resistance determining technique. Such a technique is well known in the DMM art and is the standard method for measuring low resistance. It eliminates the resistance of the test leads and contact resistance from the measurement; one pair of test leads carries the test current for determining the resistance while the other pair of test leads senses the voltage across the resistor under test. The resistance of the current-carrying leads is not material because those leads are not in the measurement path. The resistance of the sensing leads is not material because those leads do not carry any current.

A preferred embodiment of resistor network of this invention employs a control circuit including a storage device arranged to store resistance values determined by the digital resistance sensor against various switch configurations for the coarse network and adjustment settings for the fine network. Then, by providing the control circuit with an input allowing the selection of a required resistance value, the control circuit may determine the appropriate switch and adjustment values from the stored values of resistance, to allow the network to be set to the required resistance value.

FIG. 1 shows a typical prior art programmable variable resistor using a simple binary chain, as has been described above. R OFF defines the minimum value of the network when all of the relays are closed. The binary chain typically has the following values:

| R1  | 1 ohm    | R2  | 2 ohm    | R3  | 4 ohm    |
| --- | -------- | --- | -------- | --- | -------- |
| R4  | 8 ohm    | R5  | 16 ohm   | R6  | 32 ohm   |
| R7  | 64 ohm   | R8  | 128 ohm  | R9  | 256 ohm  |
| R10 | 512 ohm  | R11 | 1024 ohm | R12 | 2048 ohm |
| R13 | 4096 ohm | R14 | 8192 ohm |     |          |

A reed relay is connected across each resistor and is operated by a control program in order to allow the selection of a required resistance, achievable in 1 ohm steps from a minimum defined by R OFF to a maximum when all of the relays are open and R OFF is in series with all of the resistors R1 to R16.

Figure 2:
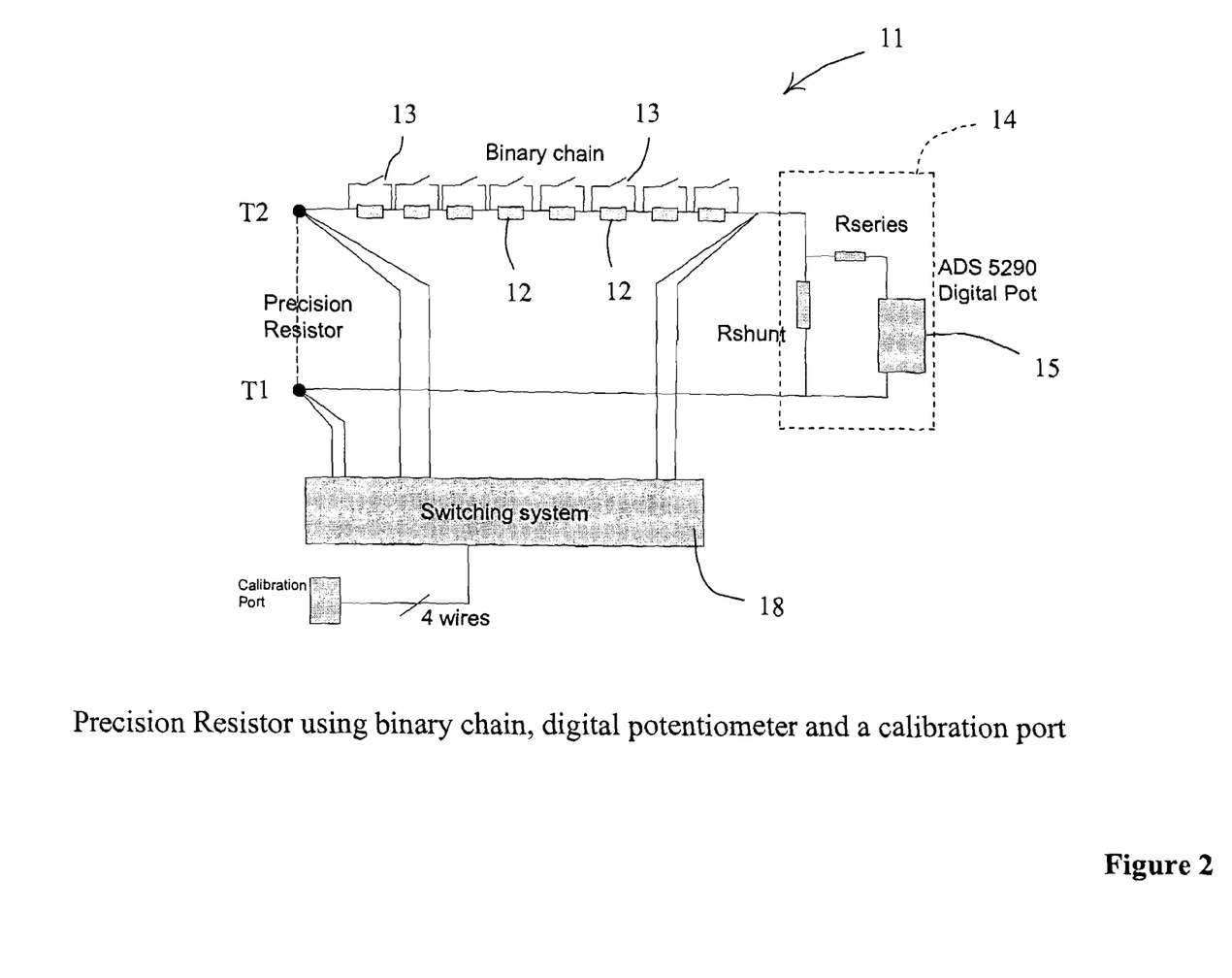
FIG. 2 is a diagram of a variable resistor network of this invention.

FIG. 2 shows an embodiment of variable resistor network of this invention. This variable resistor includes a coarse series-connected binary chain 11 of resistors 12 each of which has a relay 13 connected thereacross, in exactly the same manner as has been described above with reference to FIG. 1. Thus, the binary chain may be set to a chosen resistance value by appropriate operation of the relays. The end of the chain 11 is connected to a shunt resistor Rshunt and a fine resistance network 14 is connected across the shunt resistor Rshunt. This fine resistance network 14 includes a series resistor Rseries and a series-connected digital variable resistor 15. That resistor 15 may take the form of a digitally controlled potentiometer such as the Analog Devices AD5290 referred to above.

The AD5290 device is a digitally controlled potentiometer that can be set to a value of between nominally 0 ohm and 10 kohm and uses an 8 bit word to set the value. Since it has 8 control bits it can be set to any one of 256 values. It can be connected so that a 0 instruction provides the lowest resistance and 255 provides the highest resistance.

The fine resistance network 14 has only a small impact on the net resistance between the precision resistor terminals T1,T2 because of the presence of the shunt resistor, Rshunt and series resistor, Rseries. With the AD5290 set to zero ohm the fine network impedance is controlled by the shunt resistor in parallel with the series resistor. When the resistance of the potentiometer is set to the maximum, the impedance of the network increases. By choosing a convenient value for Rseries and Rshunt, a range of resistance control can be set. Between these values the resistance can be changed using the digital potentiometer control and in this case, 256 values can be set if a single AD5290 is used.

In FIG. 2, the use of a single digital potentiometer is shown, but two or more could be used in parallel to bring down the achievable resistance. The codes sent to each potentiometer could be the same or could be different to increase the number of steps of resistance that can be achieved. Using four potentiometers in parallel could increase the resolution from 256 steps to 1024 steps. Since the control range is very limited, the step size will be correspondingly small.

Figure 3:
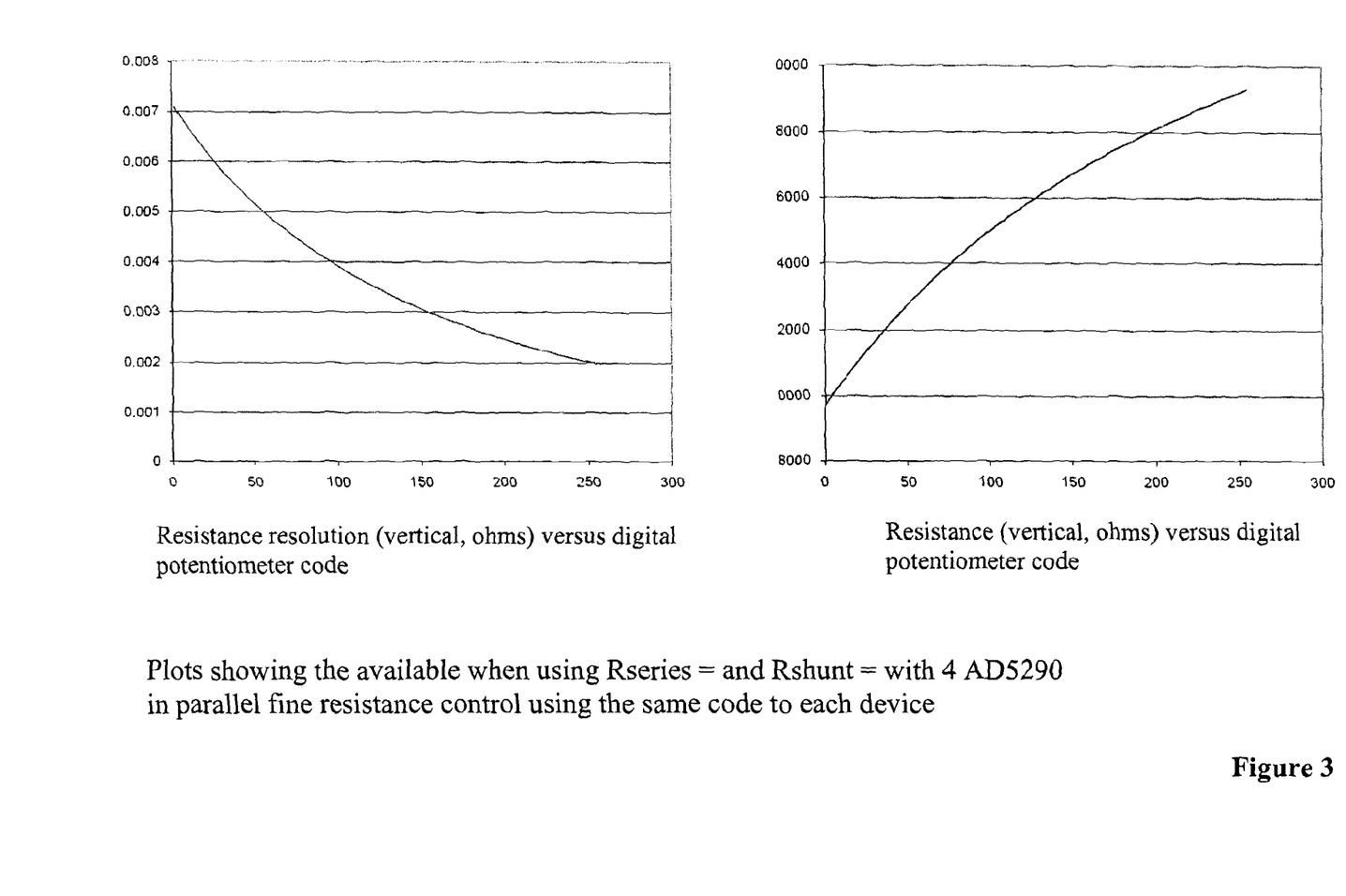
FIG. 3 are plots of certain characteristics of the variable resistor network of FIG. 2.

The plots of FIG. 3 show an example of the fine control of resistance that can be achieved with the arrangement of FIG. 2. In this example four AD5290 devices are used in parallel and Rseries has been set to 2700 ohm for each potentiometer and Rshunt set to 75 ohm. The left-hand plot in FIG. 3 shows the change of resistance for a potentiometer code increase of one (the resolution) and the right-hand plot shows the resistance variation with the code. The right-hand plot includes a net offset resistance of approximately 73 ohm introduced by Rseries and Rshunt. It can be seen that the setting resolution is much less than 10 mohm even when the same code is sent to each potentiometer. In this example, the resolution could be increased by a factor of 4 by using different codes for each of the four potentiometers.

The change of resistance across the fine network is not linear as the instruction to the potentiometer is changed. Rather, it is a curve the characteristics of which can be calculated from knowledge of the resistor values employed, as shown in FIG. 3. It is therefore relatively easy to predict the way the net resistance varies as the control of the fine network is changed.

The fine resistance network 14 need not be implemented with a digital potentiometer as described with reference to FIG. 2. Instead, a network of relays and resistors could be employed, as with the coarse network but using low value resistors. Such an approach could provide a lower resistance than with a digital potentiometer, but will occupy more space and cost more to implement.

The coarse network, in this example a binary chain, is used in a conventional manner. The network produces resistance values with a relatively coarse step size and is arranged in series with the fine network. The total resistance of the overall network is the sum of the resistances provided by the coarse and fine networks. By combining the coarse resistance setting and the fine resistance setting, any value of resistance within the range can be produced. There is then the difficulty of calibrating the system so it can produce accurately a required value of resistance.

As shown in FIG. 2, a digital multimeter (DMM) is connected to the coarse and fine networks to allow independent measurement of the resistances thereof, in this case using a 4-wire resistance measurement facility as discussed above. This technique is well known and documented and will not be discussed in more detail here. The DMM can be connected to the coarse network and to the fine network in turn, through a switching system 18, as shown in FIG. 2.

Calibration can be achieved by separately calibrating the coarse network and the fine network (conveniently here referred to as calibration segments); this allows good characterisation of the fine network without the burden of higher resistance values appearing. As will be apparent it also allows a simple summation process to be used to arrive at the required resistance value. The use of at least two calibration segments also limits the file size required to characterise the variable resistor.

Calibration is achieved by using the DMM to generate a calibration table that characterises the resistance of both the fine and coarse networks as a function of the digital control instructions sent to the two networks. In a practical implementation, the variable resistor may have a calibration port through which the DMM gains access to the variable resistor. The calibration port uses a switching system 18 to connect the DMM to reference points in the variable resistor, to allow the measurement of resistance values of the two segments and then to create a table of measured values of resistance with different control settings. The tables can be a complete set of the characteristics for all settings, which is preferable if relay and track errors are significant. In the alternative, the tables could simply characterise some of the settings—for example, the bottom, middle and top setting for the fine network with a best fit curve for the response between these points. Measuring the resistance in this way removes errors caused by relay and track resistances and by resistor tolerances.

The design need not be limited to two segments. It can be split into more segments; fine, medium and coarse segments for example. Subdividing the design into segments means that there are fewer calibration points required in the system. For example, with a system which has two segments each of which has 256 settings, the entire variable resistor has 65336 settings. Treating the variable resistor as a single segment would mean measuring and storing the values for all 65336 settings, which would be cumbersome and time consuming. Splitting the design into two segments requires only 512 measurements, less 1% of the combinations of a single segment solution. Increasing the number of segments beyond two will reduce the number of measurements further but at the expense of making the calibration switching system more complex.

When a particular value of resistance is required, the software control system for the network uses the calibration information to find what combination of coarse and fine network settings provides the required resistance. A typical implementation would use software to accept the required resistance. That resistance is first compared to the coarse calibration data and the nearest available setting below that value is selected. The remainder resistance is calculated and is then implemented by selecting the nearest available value in the fine network.

The fine network control range clearly has to be wider than the finest step of the coarse network so that it can fill all the possible resistance requests between the coarse network values. As larger resistances are requested there is considerable merit in making the coarse binary chain such that instead of increasing the resistance thereof by powers of two in each stage, the resistance is increased by a lower factor between each stage—for example 1.9 or 1.95. Doing so ensures that there is overlap between the settings that is less than the range of the fine control, even when resistors with relatively modest tolerances are used. For some resistance requests there will be more than one possible setting that will meet the requested resistance. The software control system should be arranged to select the setting that produces the best result.

In some cases it may be best to operate the fine control network near its maximum resistance since the resolution of the setting is better (one change of control bit has less effect on resistance). This arises because the effect of the fine control is not linear, as already noted and as shown in FIG. 3.

The calibration tables for the segments can be generated when the variable resistor is manufactured, typically as a precision variable resistor card. Such tables may be supplied as a vendor table embedded in the control software. However, an additional set of user tables can be produced that a user fills by initiating a set of calibration measurements with an external DMM and then loading the data to a user table in the control software. The user table should not overwrite the vendor table; it should be used as an alternative source of calibration information by the user. The use of a user table for calibration can eliminate errors introduced by factors such as temperature or changes in relay resistance with time. The vendor table need not be limited to just one set of values; several vendor tables can be used for correcting other parameters, including temperature effects.

Figure 4:
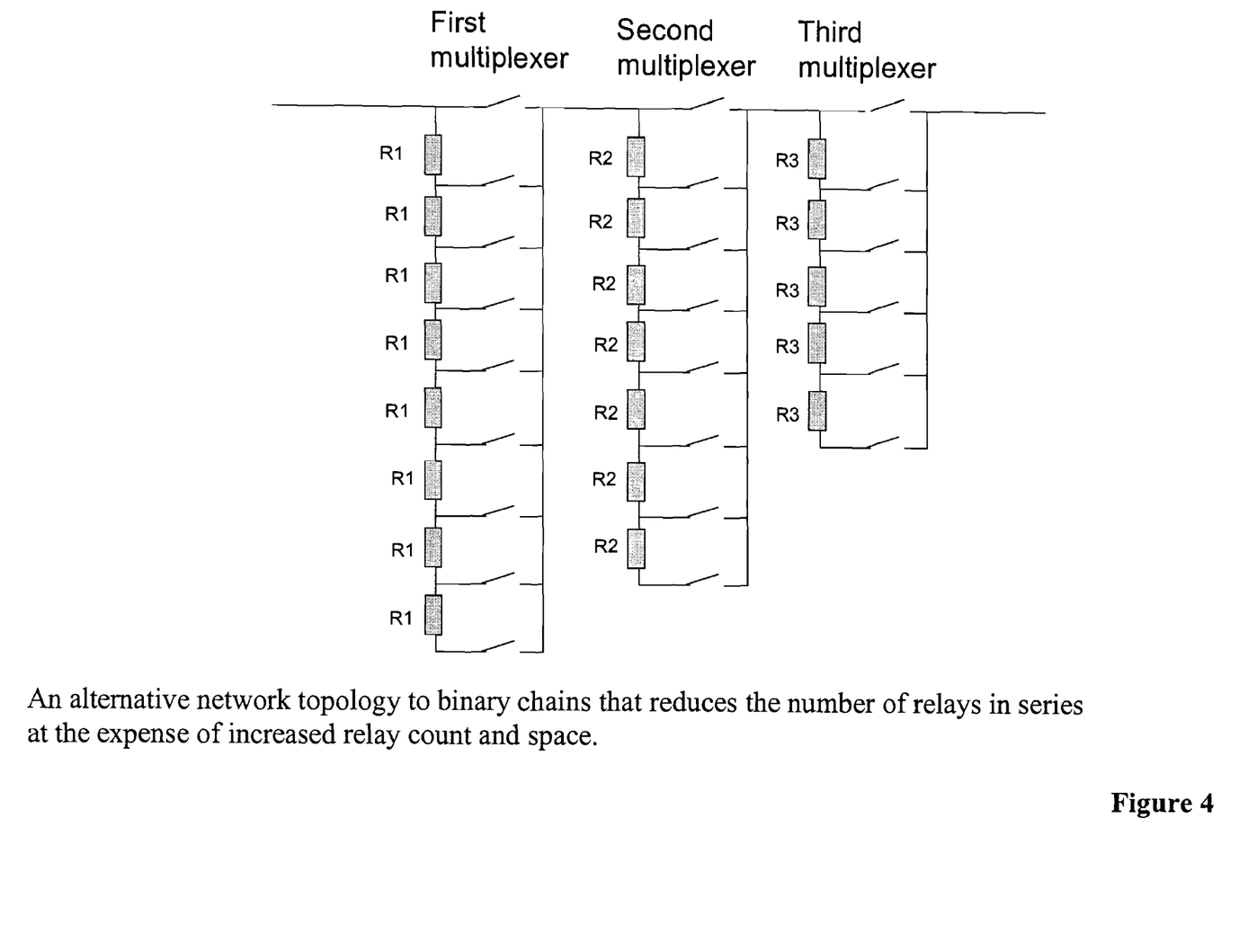
FIG. 4 shows an alternative network topology for reducing the number of relays arranged in series in the resistance chain.

Though the relay switched resistors as described above use a binary weighted arrangement, this need not be the case. Different resistor topologies may be used to minimise the number of relay contacts in series, within the network. This is particularly advantageous when simulating resistors with a low net resistance, where relay variability may be a significant issue. An example of an alternative topology is shown in FIG. 4. A network of this type can be used in series with the fine network or the coarse network. In FIG. 4, the first multiplexer network uses resistors of the same value—for example 24 ohm. The total resistance of this multiplexer can be varied between 0 ohm and 192 ohm by closing the appropriate relay. The second multiplexer also uses resistors of the same value—for example, 3 ohm and so can add a further 0 ohm to 21 ohm to the network. The third multiplexer uses resistors of the same value—for example, 0.5 ohm and can therefore add between 0 and 2.5 ohm. The complete network in this example can add between 0 and 215.5 ohm in is nominal 0.5 ohm steps. The complete network uses just three relay contacts in series, much fewer than the number required if implemented using a binary chain. The multiplexers can have any desired length to provide a convenient solution to obtain the required range of values.

Figure 5:
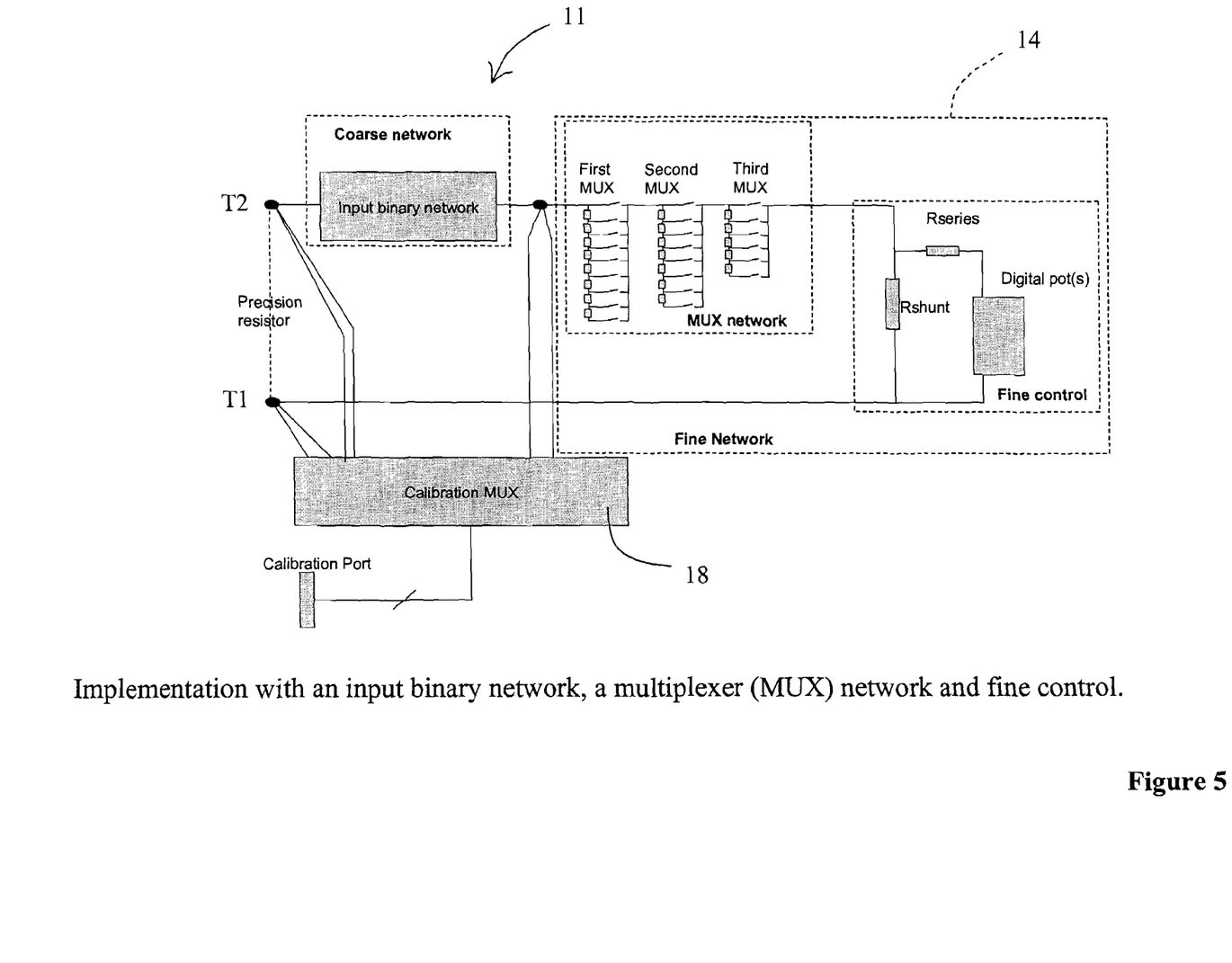
FIG. 5 shows the implementation of the network topology of FIG. 4 in the variable resistor network of FIG. 2.

FIG. 5 shows a more complex embodiment of this invention than that of FIG. 2. The implementation of FIG. 5 provides a large resistance range with excellent stability and resolution. It uses both binary and multiplexer networks and a fine control stage. In this example the multiplexer network has been included within the fine network. The input binary network provides coarse control settings and the fine network, including the multiplexer and one or more digital potentiometers, provides fine settings for the overall resistance. For calibration purposes, the network has been split into two segments which are separately characterised—namely, the coarse network consisting of the binary input network and the fine network including the multiplexer network and the fine control of the digital potentiometer. This implementation could be split into three segments consisting of the coarse network, the multiplexer network and the fine control network, at the expense of adding some complications to the calibration multiplexer.

In FIG. 5 the digital potentiometer (or each digital potentiometer, if more than one is provided) could be replaced by a relay operated network similar to the input binary network or the multiplexer network. The principle of operation would be the same but the fine control system could use lower values of resistance than those commercially available in digital potentiometers. Such a solution is particularly suited to applications requiring a relatively low starting resistance, and in particular one requiring less than 50 ohm.

While the invention has been specifically described in connection with certain specific embodiments thereof, it is to be understood that this is by way of illustration and not of limitation, and the scope of the appended claims should be construed as broadly as the prior art will permit.

What is claimed is:

1. A variable resistor network comprising a coarse network having a chain of series-connected switchable resistors, a fine network connected in series with said coarse network and comprising a shunt resistor together with a series-connected fixed resistor and adjustable resistor connected in parallel with the shunt resistor, and a control circuit arranged to control the switching of the resistors of the coarse network and adjustment of the adjustable resistor whereby a chosen resistance value can be set by appropriate switching of the coarse network and adjustment of the adjustable resistor.

2. A variable resistor network as claimed in claim 1, wherein a plurality of relays is connected one across each resistor respectively of the series-connected coarse network chain, the control circuit being arranged to control independent operation of each relay whereby the resistor associated with the relay is switchable into or out of the chain by opening or closing of the relay.

3. A variable resistor network as claimed in claim 2, wherein each said relay comprises a selected one of a reed relay and an electro-mechanical switch connected in parallel with an associated resistor.

4. A variable resistor network as claimed in claim 1, wherein the adjustable resistor of the fine network comprises a chain of series-connected switchable resistors, the control circuit being arranged to control the switching thereof.

5. A variable resistor network as claimed in claim 4, wherein a plurality of relays is connected one across each resistor respectively of the series-connected fine network chain, the control circuit being arranged to control independent operation of each relay whereby the resistor associated with the relay may be switched into or out of the chain by opening or closing of the relay.

6. A variable resistor network as claimed in claim 5, wherein each said relay comprises a selected one of a reed relay and an electromechanical switch connected in parallel with an associated resistor.

7. A variable resistor network as claimed in claim 1, wherein the adjustable resistor of the fine network comprises a software-controlled digital potentiometer, the control circuit being arranged to provide a drive signal for the digital potentiometer thereby to select a required resistance value.

8. A variable resistor network as claimed in claim 1, wherein the coarse network comprises a series-connected chain of binary resistors.

9. A variable resistor network as claimed in claim 1, wherein each resistor of the coarse network has a value of less than twice the value of the preceding resistor in the chain thereof.

10. A variable resistor network as claimed in claim 1, wherein there is a plurality of chains of series-connected switchable resistors any one or more of which chains is switchable into or out of the resistance network, as a part of the coarse network.

11. A variable resistor network as claimed in claim 1, wherein there is a plurality of chains of series-connected switchable resistors any one or more of which chains is switchable into or out of the resistance network, as a part of the fine network.

12. A variable resistor network as claimed in claim 1, wherein the variable resistor network has a pair of output terminals and the control circuit includes a digital resistance sensor connected to said output terminals.

13. A variable resistor network as claimed in claim 12, wherein the control circuit includes a digital resistance sensor connected across the fine resistor network.

14. A variable resistor network as claimed in claim 13, wherein the control circuit employs the same digital resistance sensor for sensing the resistance of the coarse and fine networks, on a time division basis.

15. A variable resistor network as claimed in claim 13, wherein the digital resistance sensor comprises a 4-wire resistance sensor.

16. A variable resistor network as claimed in claim 11, wherein the control circuit has a storage device arranged to store resistance values determined by the digital resistance sensor against switch configurations for the coarse network and adjustment settings for the fine network.

17. A variable resistor network as claimed in claim 16, wherein the control circuit has an input for the selection of a required resistance value and the control circuit is arranged to determine the appropriate switch configurations and adjustment settings from the stored values of resistance for producing the required resistance value.

18. A variable resistor network comprising a coarse network having a chain of series-connected resistors, a plurality of relays connected one in parallel with each resistor of said coarse network, a fine network connected in series with said coarse network and comprising a shunt resistor together with a series-connected fixed resistor and a software-controlled digital potentiometer connected in parallel with the shunt resistor, a control circuit arranged to control the switching of the relays of the coarse network and to control the adjustment of the digital potentiometer whereby a chosen resistance value can be set by appropriate switching of the relays of the coarse network and adjustment of the digital potentiometer, and a digital resistance sensor connected selectively across the coarse network and across the fine network, on a time-division basis.

19. A method of operating a variable resistor network comprises the steps of providing a variable resistor network as claimed in claim 1, determining the terminal resistance for the network for a wide range of switch configuration and adjustment settings; storing the determined terminal resistance values against the switch configurations and adjustment settings; comparing a required resistance value with the stored values; and then adjusting the switch configuration and the adjustable resistor setting in order to provide a terminal resistance closely corresponding to the required value.

* * * * *